(12) United States Patent
Paseuth et al.

(10) Patent No.: US 10,252,343 B2
(45) Date of Patent: Apr. 9, 2019

(54) SURFACE-COATED CUTTING TOOL AND METHOD OF PRODUCING THE SAME

(71) Applicant: SUMITOMO ELECTRIC HARDMETAL CORP., Itami-shi (JP)

(72) Inventors: Anongsack Paseuth, Sorachi-gun (JP); Hideaki Kanaoka, Sorachi-gun (JP); Shinya Imamura, Sorachi-gun (JP); Satoshi Ono, Sorachi-gun (JP)

(73) Assignee: SUMITOMO ELECTRIC HARDMETAL CORP., Itami-shi (JP)

( * ) Notice: Subject to any disclaimer, the term of this patent is extended or adjusted under 35 U.S.C. 154(b) by 132 days.

(21) Appl. No.: 15/311,587

(22) PCT Filed: Jun. 7, 2016

(86) PCT No.: PCT/JP2016/066859
§ 371 (c)(1),
(2) Date: Nov. 16, 2016

(87) PCT Pub. No.: WO2017/179218
PCT Pub. Date: Oct. 19, 2017

(65) Prior Publication Data
US 2018/0133805 A1     May 17, 2018

(30) Foreign Application Priority Data

Apr. 14, 2016   (JP) ................. 2016-081096

(51) Int. Cl.
*B23B 27/14*   (2006.01)
*C23C 16/34*   (2006.01)
(52) U.S. Cl.
CPC ............ *B23B 27/146* (2013.01); *C23C 16/34* (2013.01)

(58) Field of Classification Search
None
See application file for complete search history.

(56) References Cited

U.S. PATENT DOCUMENTS

2015/0345013 A1   12/2015   Paseuth et al.
2017/0113285 A1*  4/2017    Tatsuoka ............... C23C 28/042

FOREIGN PATENT DOCUMENTS

CN     104816141 A    8/2015
JP     2014-129562 A  7/2014
(Continued)

OTHER PUBLICATIONS

Ikeda et al., "Phase formation and characterization of hard coatings in the Ti—Al—N system prepared by the cathodic arc on plating method," Thin Solid Films 195 (1991) pp. 99-110.
(Continued)

*Primary Examiner* — Colleen P Dunn
*Assistant Examiner* — Ross J Christie
(74) *Attorney, Agent, or Firm* — Venable LLP; Michael A. Sartori; Miguel A. Lopez

(57) ABSTRACT

A surface-coated cutting tool includes a base material and a coating formed on a surface of the base material. The coating includes a first hard coating layer including crystal grains having a sodium chloride-type crystal structure. The crystal grain has a layered structure in which a first layer composed of nitride or carbonitride of $Al_xTi_{1-x}$ and a second layer composed of nitride or carbonitride of $Al_yTi_{1-y}$ are stacked alternately into one or more layers. The first layer each has an atomic ratio x of Al varying in a range of 0.6 or more to less than 1. The second layer each has an atomic ratio y of Al varying in a range of 0.45 or more to less than 0.6. The largest value of difference between the atomic ratio x and the atomic ratio y is $0.05 \leq x-y \leq 0.5$.

7 Claims, 5 Drawing Sheets

(56) References Cited

FOREIGN PATENT DOCUMENTS

| JP | 2015-163423 A | 9/2015 | | |
|----|---------------|--------|---|---|
| JP | 2015-193071 A | 11/2015 | | |
| WO | WO-2015147160 A1 | * | 10/2015 | ........... C23C 28/042 |
| WO | 2016/017790 A1 | 2/2016 | | |
| WO | 2016/047581 A1 | 3/2016 | | |

OTHER PUBLICATIONS

Setoyama et al., "Formation of cubic-AlN in TiN/AlN superlattice," Surface & Coatings Technology 86-87 (1996) pp. 225-230.
Decision to Grant Patent in counterpart Japanese Patent Application No. 2016-081096, dated Oct. 4, 2016.
International Search Report in counterpart International Application No. PCT/JP2016/066859, dated Jul. 12, 2016.
Office Action issued in U.S. Appl. No. 14/654,937 dated Nov. 8, 2018.

* cited by examiner

US 10,252,343 B2

SURFACE-COATED CUTTING TOOL AND METHOD OF PRODUCING THE SAME

TECHNICAL FIELD

The present invention relates to a surface-coated cutting tool and a method of producing the same.

This application claims the priority of Japanese Patent Application No. 2016-081096 filed on Apr. 14, 2016, the entire contents of which are hereby incorporated by reference.

BACKGROUND ART

Ikeda et al. (Non-Patent Document 1) indicates that when an "AlTiN" or "AlTiCN" coating with an atomic ratio of Al exceeding 0.7 is produced by physical vapor deposition (PVD), the layer structure of the coating changes to the wurtzite crystal structure, resulting in reduction of hardness. Setoyama et al. (Non-Patent Document 2) produced a super multilayer film of TiN/AlN by PVD in order to increase an Al content in an "AlTiN" or "AlTiCN" coating. However, it is reported that when an "AlTiN" or "AlTiCN" coating with a thickness exceeding 3 nm per AlN layer is produced, the layer structure changes to the wurtzite crystal structure, resulting in reduction of hardness. Studies have been made for further improvement in cutting performance, for example, by techniques such as increasing the atomic ratio of Al by chemical vapor deposition (CVD).

For example, Japanese Patent Laying-Open No. 2014-129562 (Patent Document 1) discloses a method in which $AlCl_3$ gas, $TiCl_4$ gas, $NH_3$ gas, $H_2$ gas, and $N_2$ gas are introduced into a reaction chamber at a pressure of 1.3 kPa and a temperature of 800° C. and then the reaction chamber is cooled at a cooling rate of 10° C./min until the temperature of the base material reaches 200° C. It is said that, with this method, a hard coating having a structure in which a 2 nm-thick TiN having the face-centered cubic lattice (fcc) structure and a 6 nm-thick AlN having the fcc structure are alternately layered can be formed by CVD.

Furthermore, Japanese Patent Laying-Open No. 2015-193071 (Patent Document 2) discloses a hard coating layer including a composite nitride layer or a composite carbonitride layer represented by $(Ti_{1-x}Al_xN)(C_yN_{1-y})$, in which the layer includes crystal grains having a cubic structure, and the composition of Ti and Al periodically varies along the normal direction to the surface of the tool base material.

CITATION LIST

Patent Document

PTD 1: Japanese Patent Laying-Open No. 2014-129562
PTD 2: Japanese Patent Laying-Open No. 2015-193071

Non Patent Document

NPD 1: T. Ikeda et al., "Phase formation and characterization of hard coatings in the Ti—Al—N system prepared by the cathodic arc ion plating method", Thin Solid Films 195 (1991) 99-110
NPD 2: M. Setoyama et al., "Formation of cubic-AlN in TiN/AlN superlattice", Surface & Coatings Technology 86-87 (1996) 225-230

SUMMARY OF INVENTION

A surface-coated cutting tool according to an aspect of the present invention includes a base material and a coating formed on a surface of the base material. The coating includes a first hard coating layer including crystal grains having a sodium chloride-type crystal structure. The crystal grain has a layered structure in which a first layer composed of nitride or carbonitride of $Al_xTi_{1-x}$ and a second layer composed of nitride or carbonitride of $Al_yTi_{1-y}$ are stacked alternately into one or more layers. The first layer each has an atomic ratio x of Al varying in a range of 0.6 or more to less than 1. The second layer each has an atomic ratio y of Al varying in a range of 0.45 or more to less than 0.6. The largest value of difference between the atomic ratio x and the atomic ratio y is $0.05 \leq x-y \leq 0.5$. The first layer and the second layer adjacent to each other have a total thickness of 5 to 40 nm. In the crystal grains, when the crystal orientation of each crystal grain is analyzed in a cross section parallel to a normal direction of the surface of the base material using an electron backscatter diffraction system to determine an angle of intersection between a normal to a (111) plane that is a crystal plane of the crystal grain and a normal to the surface of the base material, the crystal grains having the angle of intersection of 0 to 45 degrees are classified in units of 0 degree to 5 degrees to form nine groups, and a frequency that is the sum of areas of the crystal grains included in each group is calculated, a total of the frequencies of four groups including the crystal grains having the angle of intersection of 0 to 20 degrees is 60% or more and 100% or less of a total of the frequencies of all groups.

A method of producing a surface-coated cutting tool according to an aspect of the present invention includes a first step of preparing the base material and a second step of forming the coating including the first hard coating layer by chemical vapor deposition.

DESCRIPTION OF EMBODIMENTS

Figure 1A:
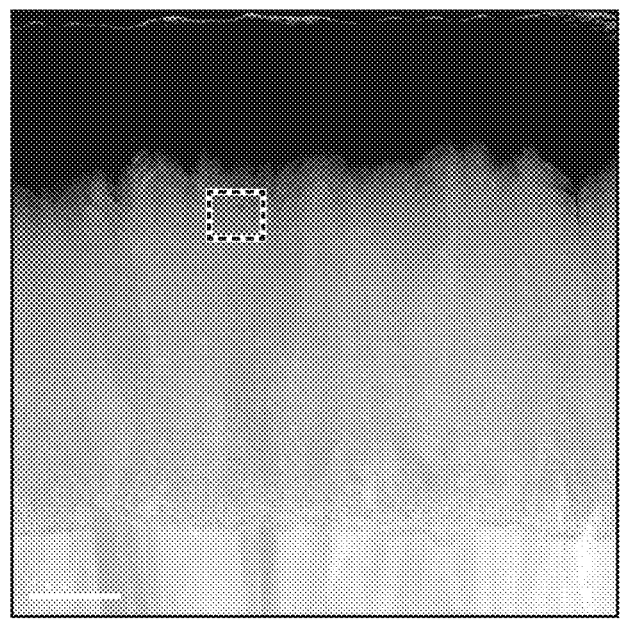
FIG. 1A is a photograph drawing of a microscopic image of the coating in a surface-coated cutting tool.

Problems to be Solved by the Present Disclosure

In Patent Document 1, since the hard coating is formed of a single structure in which TiN having the fcc structure and AlN having the fcc structure are alternately layered, the hard coating has an extremely high hardness and satisfactory wear resistance. However, when the hard coating described in Patent Document 1 is used for a cutting tool, chipping may occur in high-speed cutting, or a loss abruptly occurs in some materials to be cut, resulting in a failure to achieve a long life of the cutting tool. The reason for this is not clear but is presumably that excessive quenching causes strong tensile residual stress in AlN having the fcc structure due to lattice mismatch at the interface between TiN having the fcc structure and AlN having the fcc structure.

According to Patent Document 2, the composite nitride layer or the composite carbonitride layer has a cubic structure and the composition of Ti and Al varies periodically along the normal direction to the base material, whereby the resulting hard coating layer has high hardness and excellent toughness. This hard coating layer, however, has room for improvement in particular in chipping resistance. The required long life is not yet achieved and there has been a strong demand for development in this regard.

It is then an object to provide a surface-coated cutting tool having particularly high hardness to exhibit excellent performance in wear resistance while exhibiting high chipping resistance, and a method of producing the same.

Effects of the Present Disclosure

According to the present disclosure, particularly high hardness and excellent performance in wear resistance with high chipping resistance can be achieved.

DESCRIPTION OF EMBODIMENTS OF THE PRESENT INVENTION

First of all, embodiments of the present invention are listed below.

[1] A surface-coated cutting tool according to an aspect of the present invention includes a base material and a coating formed on a surface of the base material. The coating includes a first hard coating layer including crystal grains having a sodium chloride-type crystal structure. The crystal grain has a layered structure in which a first layer composed of nitride or carbonitride of $Al_xTi_{1-x}$ and a second layer composed of nitride or carbonitride of $Al_yTi_{1-y}$ are stacked alternately into one or more layers. The first layer each has an atomic ratio x of Al varying in a range of 0.6 or more to less than 1. The second layer each has an atomic ratio y of Al varying in a range of 0.45 or more to less than 0.6. The largest value of difference between the atomic ratio x and the atomic ratio y is $0.05 \leq x-y \leq 0.5$. The first layer and the second layer adjacent to each other have a total thickness of 5 to 40 nm. In the crystal grains, when the crystal orientation of each crystal grain is analyzed in a cross section parallel to a normal direction of the surface of the base material using an electron backscatter diffraction system to determine an angle of intersection between a normal to a (111) plane that is a crystal plane of the crystal grain and a normal to the surface of the base material, the crystal grains having the angle of intersection of 0 to 45 degrees are classified in units of 0 degree to 5 degrees to form nine groups, and a frequency that is the sum of areas of the crystal grains included in each group is calculated, a total of the frequencies of four groups including the crystal grains having the angle of intersection of 0 to 20 degrees is 60% or more and 100% or less of a total of the frequencies of all groups. The surface-coated cutting tool with such a configuration has particularly high hardness to exhibit excellent performance in wear resistance while exhibiting high chipping resistance to achieve a long life.

[2] In the surface-coated cutting tool, a total of the frequencies of two groups including the crystal grains having the angle of intersection of 10 to 20 degrees is 40% or more and 100% or less of a total of the frequencies of all groups. With this configuration, more excellent chipping resistance can be achieved.

[3] The coating includes a second hard coating layer between the base material and the first hard coating layer. The second hard coating layer has a thickness of 0.01 to 0.5 µm. With this configuration, the first hard coating layer having high hardness and high adhesiveness can be achieved.

[4] The first hard coating layer has a thickness of 1 to 15 µm. With this configuration, more excellent performance can be achieved also in wear resistance and oxidation resistance.

[5] The first hard coating layer has an indentation hardness by nanoindentation of 30 GPa or more and 40 GPa or less. With this configuration, when applied to a cutting tool, the cutting edge can be improved in wear resistance.

[6] The first hard coating layer has an absolute value of compression residual stress of 0.5 GPa or more and 3.0 GPa or less. With this configuration, when applied to a cutting tool, the cutting edge can be improved in toughness and exhibit more excellent chipping resistance.

[7] A method of producing a surface-coated cutting tool according to an aspect of the present invention includes a first step of preparing the base material and a second step of forming the coating including the first hard coating layer by chemical vapor deposition. With this method, a surface-coated cutting tool can be produced, which particularly has high hardness to exhibit excellent performance in wear resistance while exhibiting high chipping resistance.

[8] The second step includes the step of growing the crystal grains while varying a flow rate of one or both of $AlCl_3$ gas and $TiCl_4$ gas. With this method, a surface-coated cutting tool particularly exhibiting high hardness and excellent performance in wear resistance while exhibiting high chipping resistance can be produced with high yield.

Details of Embodiments of the Present Invention

Embodiments will be described below. In the drawings for use in the description of embodiments below, the same reference signs denote the same parts or corresponding parts.

As used in the present description, the expression in the form of "A to B" means the upper limit and the lower limit of a range (in other words, A or more and B or less), and in a case where the unit is not described for A and the unit is described for B alone, the unit for A and the unit for B are the same. When a chemical compound is expressed by a chemical formula in the present description, all atomic ratios conventionally known are included unless a particular atomic ratio is specified, and embodiments are not necessarily limited to those in a stoichiometric range. For example, in a description of "TiAlN", the ratio of atomicity in TiAlN is not limited to Ti:Al:N=0.5:0.5:1, and all atomic ratios conventionally known are included. This is applicable to a description of chemical compounds other than "TiAlN". In the present embodiment, metal elements such as titanium (Ti), aluminum (Al), silicon (Si), tantalum (Ta), and chromium (Cr), and a nonmetal element such as nitrogen (N), oxygen (O), or carbon (C) do not necessarily constitute a stoichiometric composition.

<<Surface-Coated Cutting Tool>>

A surface-coated cutting tool according to the present embodiment includes a base material and a coating formed on a surface of the base material. Preferably, the coating covers the entire surface of the base material. However, the base material partially not coated with this coating or with the coating having a partially different constitution does not depart from the scope of the present invention.

The surface-coated cutting tool according to the present embodiment particularly has high hardness to exhibit excellent performance in wear resistance while exhibiting high chipping resistance to achieve a long life. The surface-coated cutting tool according to the present embodiment therefore can be used suitably as a cutting tool such as a drill, an end mill, a cutting edge-replaceable cutting tip for drills, a cutting edge-replaceable cutting tip for end mills, a cutting edge-replaceable cutting tip for milling, a cutting edge-replaceable cutting tip for turning, a metal saw, a gear cutting tool, a reamer, and a tap.

<<Base Material>>

Any base material that is conventionally known as the base material of this kind can be used. For example, any one of cemented carbides (for example, including WC-based cemented carbides and those containing WC and Co or additionally including carbonitrides of Ti, Ta, and Nb), cermets (mainly composed of TiC, TiN, TiCN, or others), high-speed steel, ceramics (titanium carbide, silicon carbide, silicon nitride, aluminum nitride, aluminum oxide, or others), sintered cubic crystal boron nitride, and sintered diamond is preferred.

Among those base materials, cemented carbide, in particular, WC-based cemented carbide, or cermet (in particular, TiCN-based cermet) is preferably selected. Theses base materials are particularly well balanced in hardness and strength at high temperatures and have excellent characteristics as base materials of surface-coated cutting tools for the above-noted applications. When WC-based cemented carbide is used as a base material, its structure may include both or one of free carbon and an abnormal layer called η phase.

When the surface-coated cutting tool is, for example, a cutting edge-replaceable cutting chip, the base material may include the one having a chip breaker or the one not having a chip breaker. The shape of the cutting edge ridge is any one of sharp edge (ridge where the rake face and the flank face intersect), honing (sharp edge processed to be rounded), negative land (beveled), and a combination of honing and negative land.

<<Coating>>

Figure 1B:
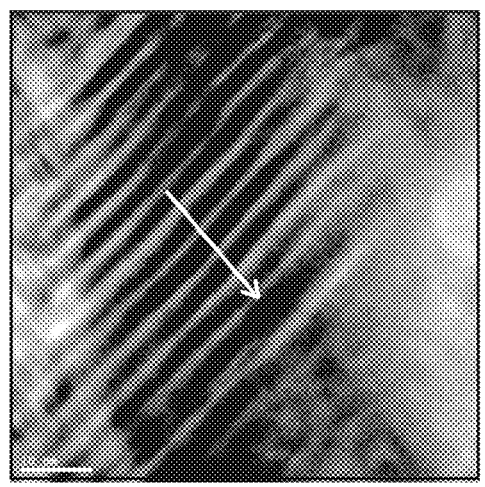
FIG. 1B is a photograph drawing showing an enlarged view of the dashed box in FIG. 1A.

In the present embodiment, the coating includes a first hard coating layer including crystal grains having a sodium chloride-type crystal structure. The sodium chloride-type crystal structure of the crystal grains included in the first hard coating layer can be observed through analysis using an X-ray diffractometer (for example, trade name: "SmartLab" manufactured by Rigaku Corporation). FIG. 1A and FIG. 1B show an example of the coating in the present embodiment (STEM image).

<First Hard Coating Layer>

(Layered Structure of Crystal Grain)

The crystal grain included in the first hard coating layer has a layered structure in which a first layer composed of nitride or carbonitride of $Al_xTi_{1-x}$ and a second layer composed of nitride or carbonitride of $Al_yTi_{1-y}$ are stacked alternately into one or more layers. The atomic ratio x of Al in the first layer varies in a range of 0.6 or more to less than 1 in each first layer, and the atomic ratio y of Al in the second layer varies in a range of 0.45 or more to less than 0.6 in each second layer. In other words, the crystal grain included in the first hard coating layer has a layered structure in which the first layer having the atomic ratio of Al varying with a high ratio being kept and the second layer having the atomic ratio of Al varying with a relatively low ratio being kept compared with the first layer are arranged alternately.

More specifically, as shown in FIG. 1A, each crystal grain included in the first hard coating layer is a homo-structure of nitride or carbonitride of AlTi in which the atomic ratio of Al varies in the inside of this homo-structure. Preferably, this variation is periodic and continuous or stepwise. Thus, as shown in FIG. 1B, in the crystal grain included in the first hard coating layer, minute distortion occurs at a predetermined interface to form a layered structure including the first layer and the second layer distinguishable as different layers based on this distortion. An example of the variation of atomic ratio of Al will be described later using FIG. 2.

The first layer and the second layer may be composed of either nitride or carbonitride. It should be noted that when the first layer is composed of nitride, the second layer is also composed of nitride. When the first layer is composed of carbonitride, the second layer is also composed of carbonitride. When the first layer is composed of nitride, the second layer is not to be composed of carbonitride. When the first layer is composed of carbonitride, the second layer is not to be composed of nitride.

At least two crystal grains are included in the first hard coating layer, and preferably three or more are included. The crystal grain included in the first hard coating layer preferably has a twin crystal structure. More preferably, when the coincidence boundary denoted by a symbol Σ3 in the crystal structure of the twin crystal is a line-symmetric axis, the above-noted layered structure exists on both sides of this axis.

As described above, the crystal grain has a sodium chloride-type crystal structure and has distortion based on the layered structure including the first layer and the second layer in the grain. This distortion improves the hardness of the crystal grain. Therefore, the coating (first hard coating layer) in the present embodiment can be improved in wear resistance. As a result, the surface-coated cutting tool including the base material coated with such a coating has excellent wear resistance to achieve a long life.

(Atomic Ratio of Al)

As previously mentioned, the first hard coating layer has a layered structure in which the first layer composed of nitride or carbonitride of $Al_xTi_{1-x}$ and the second layer composed of nitride or carbonitride of $Al_yTi_{1-y}$ are stacked alternately into one or more layers in the crystal grain. In this layered structure, the atomic ratio x of Al in each first layer varies in a range of 0.6 or more to less than 1. The atomic ratio y of Al in each second layer varies in a range of 0.45 or more to less than 0.6. Furthermore, the largest value of the difference between the atomic ratio x and the atomic ratio y is $0.05 \leq x-y \leq 0.5$.

The largest value of the difference between the atomic ratio x and the atomic ratio y refers to a value obtained by calculating the values of the atomic ratio x and the atomic ratio y based on a cross-section sample by a method described later, and then obtaining the difference between the largest value of all of the calculated values of the atomic ratio x and the smallest value of all of the calculated values of the atomic ratio y. That is, it is equivalent to the value obtained when the difference between the largest value of the atomic ratio x and the smallest value of the atomic ratio y selected from the values in the entire first hard coating layer.

When the largest value of the difference between the atomic ratio x and the atomic ratio y is less than 0.05, the distortion in the crystal grain is small and the hardness tends to be reduced. On the other hand, when the largest value of the difference exceeds 0.5, the distortion in the crystal grain increases, the tensile residual stress increases, and accordingly, the toughness tends to be reduced.

Figure 2:
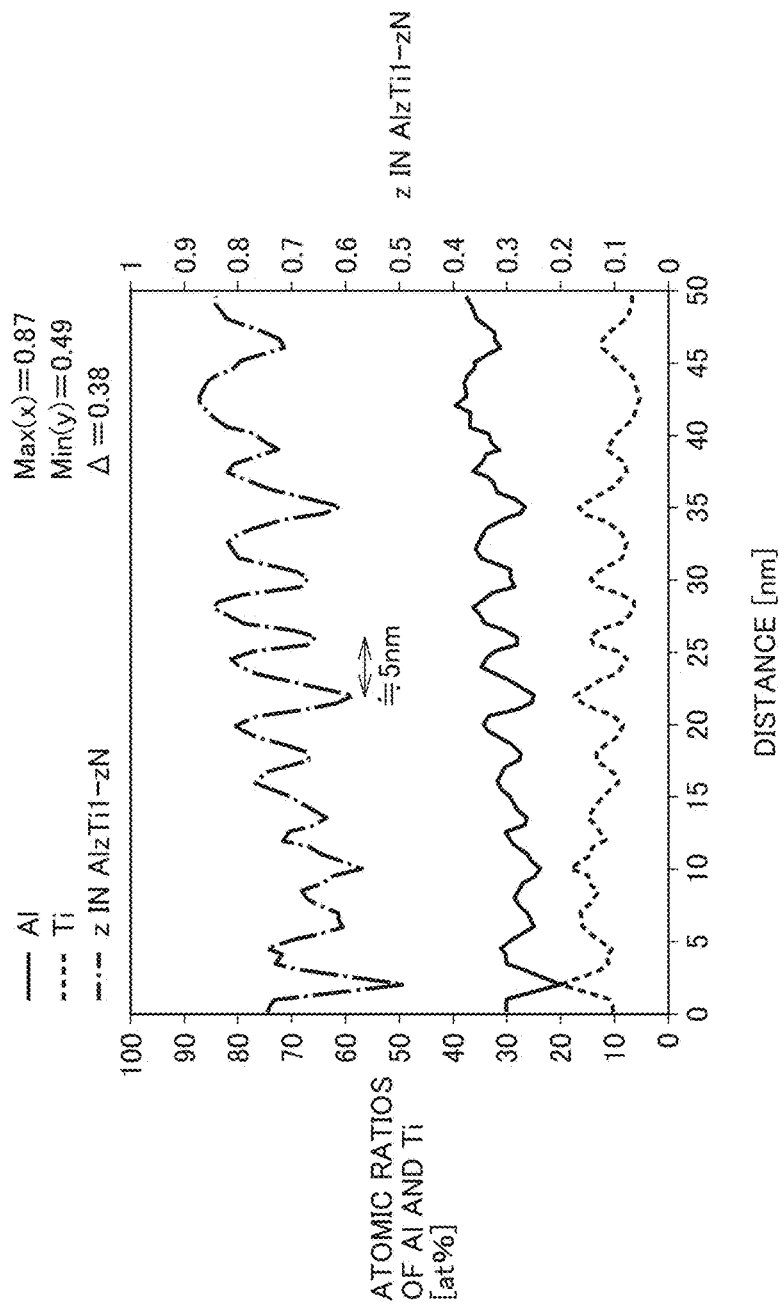
FIG. 2 is a graph illustrating variation of the AlTiN composition ratio in the arrow direction in FIG. 1B.

FIG. 2 shows a graph illustrating an example in which the atomic ratio of Al in the crystal grain varies periodically and continuously in the stacked direction of the first layer and the second layer (the arrow direction in FIG. 1B). In FIG. 2, the horizontal axis represents a measurement position (distance from the measurement start portion) on the normal relative to the surface of the base material and passing through the crystal grain, and the vertical axis represents the atomic ratios of Al and Ti at each measurement position, and the atomic ratio (proportion) of Al in the total of atomic ratios of Al and Ti. The atomic ratio z in FIG. 2 is used to collectively represent both of the atomic ratio x and the atomic ratio y.

In FIG. 2, as the distance from the measurement start position increases, for example, the value of the atomic ratio of Al continuously increases and then reaches a maximal point and thereafter continuously decreases toward the minimal point. After passing through this minimal point, the value turns to a continuous increase toward the next maximal point again, and such variation is subsequently repeated several times. Based on this, it is understood that the atomic ratio of Al periodically and continuously varies in the stacked direction of the first layer and the second layer. Furthermore, the decrease in the atomic ratio of Al, that is, the increase in the atomic ratio of Ti causes distortion, which is recognized as a striped stacking state of the first layer and the second layer as shown in FIG. 1B. In FIG. 2, the shape of the variation of the atomic ratio of Al is like a sinusoidal wave. The width of one cycle including a continuous increase and a continuous decrease adjacent to each other represents the total thickness of adjacent first layer and second layer.

The atomic ratio x and the atomic ratio y are obtained as follows. A cross-section sample parallel to the normal direction of the surface of the base material in the first hard coating layer is obtained, and the crystal grain appearing in this cross-section sample is analyzed using an energy dispersive X-ray spectroscopy (EDX) system installed in an SEM or a TEM to calculate the atomic ratio at the analyzed position. The analysis using EDX is repeated to expand the target for calculating the atomic ratio x and the atomic ratio y over the entire surface of the cross-section sample. Thus, the atomic ratio x and the atomic ratio y at a certain position in the first hard coating layer can be specified by obtaining a cross-section sample in a certain position of the first hard coating layer.

The atomic ratio x of Al in the first layer is not to be less than 0.6. This is because the atomic ratio x of less than 0.6 should be rather called the atomic ratio y of Al in the second layer. Based on the same reason, the atomic ratio y is not to be 0.6 or more. The atomic ratio x is not 1 because the first layer includes Ti. On the other hand, in terms of keeping high toughness while improving wear resistance, the atomic ratio y is 0.45 or more. If the atomic ratio y is less than 0.45, the decrease in Al amount causes degradation in oxidation resistance, which increases the possibility that wear resistance is reduced due to oxidation of the coating.

The upper limit value of the atomic ratio of Al in the crystal grain, that is, the preferable upper limit value of the atomic ratio x is 0.95. The lower limit value of the atomic ratio of Al in the crystal grain, that is, the preferable lower limit value of the atomic ratio y is 0.5. The preferable largest value of the difference between the atomic ratio x and the atomic ratio y is 0.1 or more and 0.45 or less. The more preferable largest value of the difference between the atomic ratio x and the atomic ratio y exceeds 0.15 and is 0.45 or less.

(Thickness of Adjacent First Layer and Second Layer)

In the present embodiment, the total thickness of adjacent first layer and second layer (which hereinafter may be referred to as "stacking cycle") is 5 to 40 nm. For example, FIG. 2 illustrates that the stacking cycle is about 5 nm. The layered structure including the first layer and the second layer with such a thickness makes the crystal grain hard and improves toughness. In particular, the crystal grain is oriented in the crystal orientation as described later whereby the hardness of the crystal grain is significantly increased, which more effectively contributes to the wear resistance of the surface-coated cutting tool.

When the total thickness of the adjacent first layer and second layer is less than 5 nm, the toughness is reduced. On the other hand, when it exceeds 40 nm, the crystal grain changes to the wurtzite crystal structure, so that the hardness tends to be reduced to adversely affect the wear resistance. The total thickness of the adjacent first layer and second layer is preferably 6 to 20 nm.

At least one set of adjacent first layer and second layer may have a thickness of 5 to 40 nm. However, it is preferable that all sets of adjacent first layer and second layer have a thickness of 5 to 40 nm because if so, a coating with excellent wear resistance can be produced stably.

The thicknesses of the first layer and the second layer can be accurately measured by obtaining a cross-section sample parallel to the normal direction of the surface of the base material in the first hard coating layer and observing this sample with an STEM, in the same manner as when the atomic ratio x and the atomic ratio y are measured. Examples of such a measurement method using an STEM includes high-angle annular dark-field scanning transmission electron microscopy (HAADF-STEM). As used in the present description "thickness" means the average thickness. The total thickness of the adjacent first layer and second layer is obtained as follows. For example, cross-sections are obtained at 10 locations in the first hard coating layer, and in 10 crystal grains appearing in the cross sections, the respective total thicknesses of 10 sets of adjacent first layer and second layer are measured. The average value of the total thicknesses can be expressed as the total thickness. In doing so, with the observation magnification of 500000 times and with the observation area of about 0.1 µm$^2$, adjustment is made such that one crystal grain appears in a field of view. This is repeatedly performed 10 times or more to measure a sufficient number of "the total thickness of adjacent first layer and second layer" to calculate the average value.

(Determination of Angle of Intersection Frequency Distribution for (111) Plane of Crystal Grain)

In the crystal grains of the present embodiment, the crystal orientation of the crystal grain in a cross section parallel to the normal direction of the surface of the base material is analyzed using an electron back scatter diffraction (EBSD) system to determine the angle of intersection between the normal to the (111) plane that is a crystal plane of the crystal grain and the normal to the surface of the base material. The crystal grains having the angle of intersection of 0 to 45 degrees are classified in units of 0 degree to 5 degrees to form nine groups. The frequency that is the sum of the areas of the crystal grains included in each group is calculated. Then, the total of frequencies of four groups including crystal grains having the angle of intersection of 0 to 20 degrees is 60% or more and 100% or less of the total of frequencies of all of the groups. The total of frequencies of four groups including the crystal grains having the angle of intersection of 0 to 20 degrees falls in such a range, whereby the crystal grains are improved particularly in hardness to contribute to excellent wear resistance of the surface-coated cutting tool.

In the following, measuring the angles of intersection of individual crystal grains that constitute the first hard coating layer and determining their distribution is referred to as "determining the angle of intersection frequency distribution".

In the present embodiment, the angle of intersection frequency distribution is determined using a field-emission scanning electron microscope (FE-SEM) equipped with an EBSD system. A cross section parallel to the normal direction of the surface of the base material is polished to obtain a polished cross section serving as a surface to be measured, and the angle of intersection of the (111) plane of each individual crystal grain included in the first hard coating layer is measured. The polished cross section serving as a surface to be measured can be obtained by polishing the cross section with waterproof abrasive paper and further performing ion milling using argon ions.

The polishing process for preparing a surface to be measured (polished cross section) required for determining the angle of intersection frequency distribution is as follows.

First of all, the first hard coating layer is formed based on the production process described later. This first hard coating layer is cut so as to obtain a cross section parallel to the normal direction of the surface of the base material. Thereafter, the cut surface is polished with waterproof abrasive paper (the one including SiC crystal grain abrasive as an abrasive).

The cutting is performed as follows. For example, the surface of the first hard coating layer (or the coating surface in a case where another layer is formed on the first hard coating layer) is tightly fixed using wax on a flat plate large enough to hold, and thereafter cut in a direction vertical to the flat plate with a cutter with a rotary blade (cut such that the rotary blade is set as vertical as possible to the flat plate). This is because the surface of the base material and the surface of the first hard coating layer (coating surface) are thought to be parallel. This cutting can be performed at any part in the first hard coating layer as long as it is performed in a vertical direction in this way. The resultant cross section is polished and smoothed as described below to prepare a surface to be measured.

The polishing is performed using the above-noted waterproof abrasive paper #400, #800, #1500 in this order (the numbers (#) of the waterproof abrasive paper mean different crystal grain diameters of the abrasive. The larger the number is, the smaller the grain diameter of the abrasive is).

Subsequently, the cross section polished with the above-noted waterproof abrasive paper is further smoothed by ion milling with Ar ions. The conditions of ion milling are, for example, as follows:

acceleration voltage: 6 kV
radiation angle: 0° in the normal direction of the base material surface
radiation time: six hours.

Thereafter, the polished cross section of the smoothed first hard coating layer is observed with an EBSD system-equipped FE-SEM. This observation can be performed by arranging focused electron beams individually on pixels and acquiring EBSD data successively. For example, an FE-SEM equipped with HKL NL02 EBSD detector (trade name: "Zeiss Supra 35 VP" manufactured by CARL ZEISS AG) can be used.

The observation of the surface to be measured with an EBSD system-equipped FE-SEM is as follows. The EBSD system can determine the crystal orientation in which a crystal grain is oriented and the degree of angle by which this crystal orientation intersects with the normal to the surface of the base material (angle of intersection), based on automatic analysis of the Kikuchi diffraction pattern produced by back diffraction electrons. The angle of intersection frequency distribution can be obtained by capturing a surface to be measured using an EBSD system-equipped FE-SEM, calculating the angle of intersection between the normal direction of the surface of the base material and the normal direction of the (111) plane in each pixel of the captured image, and performing statistical processing. As a result, for example, the pixel with the calculated angle of intersection within 0 to 5 degrees corresponds to a crystal grain in which the angle of intersection between the normal to the surface of the base material and the normal of the (111) plane is 0 to 5 degrees. Therefore, for example, the total number of pixels with the calculated angle of intersection within 0 to 5 degrees corresponds to the sum of areas of crystal grains having the angle of intersection within 0 to 5 degrees.

In the present embodiment, the pixels with the calculated angle of intersection of 0 to 45 degrees are selected and classified by colors in units of 0 degree to 5 degrees to form nine groups. In each of these nine groups, the total number of pixels, that is, the frequency, which is the sum of areas of crystal grains, is calculated to determine the angle of intersection frequency distribution. In this manner, in the present description, "frequency" is calculated for each group as the sum of areas of crystal grains appearing in a surface to be measured that are included in the group.

In determining the angle of intersection frequency distribution, it is preferable to appropriately select an observation magnification of the FE-SEM from the range of 2000 to 20000 times and also appropriately select the observation area from the range of 50 to 1000 μm² so that 10 to 100 crystal grains appear in a field of view, in terms of ensuring accuracy.

The calculation of the angle of intersection, the selection of pixels in which the angle of intersection is 0 to 45 degrees, and the calculation of the frequency can be performed using commercially-available software (trade name: "Orientation Imaging Microscopy Ver 6.2" manufactured by EDAX Inc.).

In the present embodiment, except for the group into which crystal grains having the angle of intersection of 0 to 5 degrees are classified, the smallest angle of intersection in each group is not included in the group. Therefore, crystal grains having the angle of intersection of 0 degree and 5 degrees are classified into the group of 0 to 5 degrees. Crystal grains having the angle of intersection of 10 degrees are not classified into the group of 10 to 15 degrees but classified into the group of 5 to 10 degrees. That is, 10 to 15 degrees mean exceeding 10 degrees and not more than 15 degrees.

Here, in the first hard coating layer in the present embodiment, the total of frequencies of four groups that include crystal grains having the angle of intersection of 0 to 20 degrees (that is, crystal grains having the angle of intersection of 20 degrees or less) is 60% or more and 100% or less of the total of frequencies of all of the groups. In particular, in the present embodiment, it is preferable that the total of frequencies of two groups including crystal grains having the angle of intersection of 10 to 20 degrees is 40% or more and 100% or less of the total of frequencies of all of the groups.

The first hard coating layer including crystal grains as described above has high hardness because the crystal grains keep the sodium chloride-type crystal structure. Furthermore, in the present embodiment, the total of frequencies of four groups including crystal grains having the angle of intersection of 0 to 20 degrees is 60% or more of the total of frequencies of all of the groups and takes up a large proportion. That is, in the first hard coating layer, the crystal grains in which the almost the same direction (0 to 20 degrees) as the normal direction of the surface of the base material is the (111) plane are present at high frequency. Such a first hard coating layer has significant high hardness and therefore can be further improved in wear resistance.

In particular, when the total of frequencies of two groups including crystal grains having the angle of intersection of 10 to 20 degrees is 40% or more of the total of frequencies of all of the groups, the toughness can be improved drastically. Thus, since wear resistance can be improved while toughness is kept, it is possible to form the first hard coating layer very excellent in wear resistance and thus to achieve a long life of the surface-coated cutting tool. The reason for this is not clear but is presumably that the normal direction to the (111) plane of the crystal grain is shifted by about 10 to 20 degrees from the normal direction to the surface of the base material, thereby alleviating impact applied on the hard coating in the order of microns at the start point of cutting involving highest load.

In the present embodiment, it is preferable that the total of frequencies of four groups including crystal grains having the angle of intersection of 0 to 20 degrees is 70% or more of the total of frequencies of all of the groups. It is more preferable that the total of frequencies of two groups including crystal grains having the angle of intersection of 10 to 20 degrees is 40% or more of the total of frequencies of all of the groups. When the total of frequencies of four groups including crystal grains having the angle of intersection of 0 to 20 degrees is less than 60% of the total of frequencies of all of the groups, the hardness fails to be improved sufficiently. The upper limit values of the total of frequencies of four groups including crystal grains having the angle of intersection of 0 to 20 degrees and the total of frequencies of two groups including crystal grains having the angle of intersection of 10 to 20 degrees are both 100%.

Figure 4:
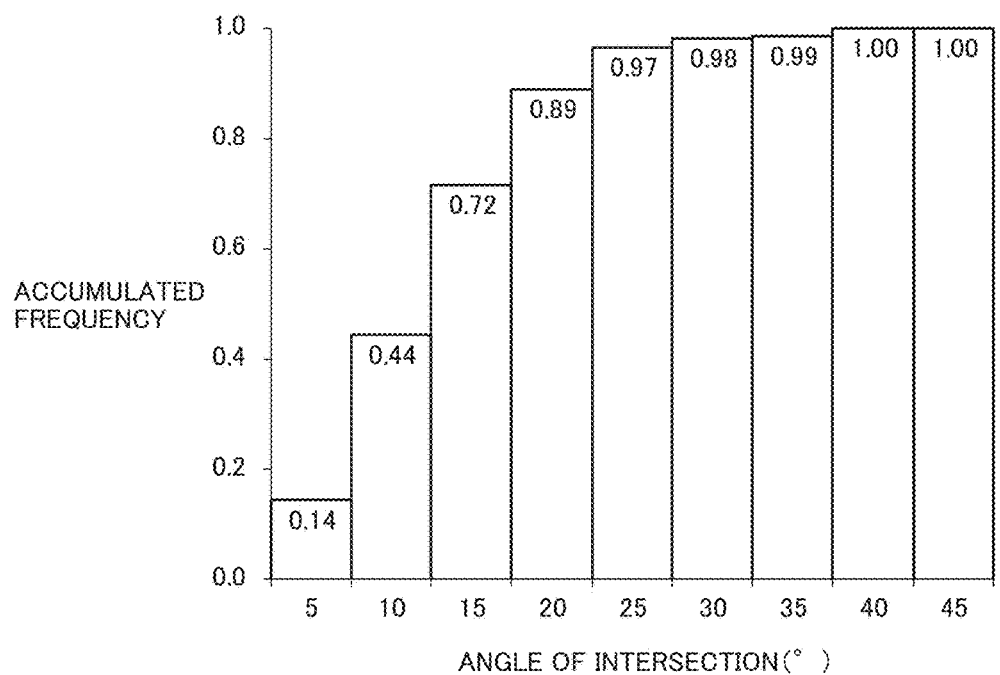
FIG. 4 is a graph illustrating an example of the angle of intersection frequency distribution of crystal grains included in a first hard coating layer analyzed using an electron backscatter diffraction system.

FIG. 4 shows an example of the graph illustrating the angle of intersection frequency distribution. The horizontal axis of this graph represents the angle of intersection in units of 0 degree to 5 degrees corresponding to nine groups into which crystal grains are classified, and the vertical axis shows the accumulated frequency. In the example shown in FIG. 4, the total of frequencies of four groups including crystal grains having the angle of intersection of 0 to 20 degrees is 89% of the total of frequencies of all of the groups. The total of frequencies of two groups including crystal grains having the angle of intersection of 10 to 20 degrees is 45% of the total of frequencies of all of the groups.

(Indentation Hardness)

In the first hard coating layer, it is preferable that the indentation hardness by nanoindentation is 30 GPa or more and 40 GPa or less. More preferably, the indentation hardness is 32 GPa or more and 38 GPa or less. When the indentation hardness by nanoindentation of the first hard coating layer falls in the above-noted range, wear resistance of the surface-coated cutting tool according to the present embodiment is improved. In particular, excellent performance is achieved in cutting materials difficult to cut, such as heat-resistant alloys.

The indentation hardness by nanoindentation of the first hard coating layer can be measured using a micro-minute indentation hardness tester that allows for nanoindentation. An indenter is pushed at a predetermined load (for example 30 mN) vertically in the thickness direction of the first hard coating layer, and the indentation hardness is calculated based on the depth that the indenter is pushed into. When another layer such as a surface coating layer is present on the first hard coating layer, the surface coating layer is removed by Calotest or bevel lapping to expose the first hard coating layer, and the above-noted method is used for the exposed first hard coating layer to measure indentation hardness.

(Compression Residual Stress)

In the first hard coating layer, the absolute value of compression residual stress is preferably 0.5 GPa or more and 3.0 GPa or less. More preferably, the absolute value of compression residual stress is 0.7 GPa or more and 2.5 GPa or less. When the absolute value of compression residual stress of the first hard coating layer falls in the above-noted range, the toughness of the first hard coating layer can be improved drastically. The absolute value of compression residual stress of less than 0.5 GPa is not enough to improve the toughness. When the absolute value of compression residual stress exceeds 3.0 GPa, chipping tends to occur in cutting work due to structure destruction in the layer. The compression residual stress of the first hard coating layer can be controlled to 0.5 GPa or more and 3.0 GPa or less by adjusting the stacking cycle of the first layer and the second layer in the crystal grain included in the first hard coating layer and by performing additional surface treatment. The value of compression residual stress of the first hard coating layer means the value of average compression residual stress in one or both of the flank face and the rake face within a radius of 500 µm from the cutting edge as being the point serving to cut, unless otherwise specified.

"Compression residual stress" is a kind of internal stress (inherent strain) existing in the first hard coating layer and refers to stress expressed in "−" (minus) numerical values (unit: "GPa" in the embodiments). Therefore, the concept that compression residual stress is large indicates that the absolute value of the above-noted numerical value is large, whereas the concept that compression residual stress is small indicates that the absolute value of the numerical value is small.

The compression residual stress of the first hard coating layer can be applied by, for example, blasting, brushing, barreling, or ion injection. Furthermore, the compression residual stress of the first hard coating layer can be measured, for example, by the $\sin^2 \psi$ method using an X-ray stress analyzer. This $\sin^2 \psi$ method using X rays is widely used as a method of measuring compression residual stress of polycrystalline materials. For example, the method described in details in pp. 54 to 67 of "X-sen oryoku sokuteihou" (the Society of Materials Science, Japan, 1981, published by Yokendo Co., Ltd.) can be used. In the case where the $\sin^2 \psi$ method is applied to measure the compression residual stress of the first hard coating layer, when another layer such as a surface coating layer is present on the first hard coating layer, the surface coating layer is removed as necessary by electropolishing, flat milling, or other process to expose the first hard coating layer, and the compression residual stress is measured for the exposed first hard coating layer. The physical coefficients used for measuring stress can be cited from known literatures. For example, the values reported by N. Norrby et al. in "Surface& Coatings Technology 257 (2014) 102-107" can be used. In doing so, stress is preferably measured, considering the kind of the base material used, by selecting a diffraction peak on the high angle side and with a minimum of overlapping of peaks of the first hard coating layer and the base material.

(Impurities)

The first hard coating layer may contain or may not contain at least one impurity selected from the group consisting of chlorine (Cl), oxygen (O), boron (B), cobalt (Co), tungsten (W), chromium (Cr), tantalum (Ta), niobium (Nb), and carbon (C) as long as there is no effect on the operation effects of the present embodiment of imparting high hardness, excellent toughness, and high wear resistance. That is, the first hard coating layer is permitted to be formed to contain impurities such as inevitable impurities.

(Thickness of First Hard Coating Layer)

The first hard coating layer preferably has a thickness of 1 to 15 µm. The thickness of the first hard coating layer in the above-noted range can achieve a significant effect of improving wear resistance while keeping toughness. When the thickness of the first hard coating layer is less than 1 µm, wear resistance is not sufficient. When the thickness exceeds 15 µm, it is difficult to apply compression residual stress, and the chipping resistance tends to be insufficient. Further preferably, the first hard coating layer has a thickness of 3 µm or more and 7.5 µm or less in terms of improving its characteristics.

<Second Hard Coating Layer>

Figure 3A:
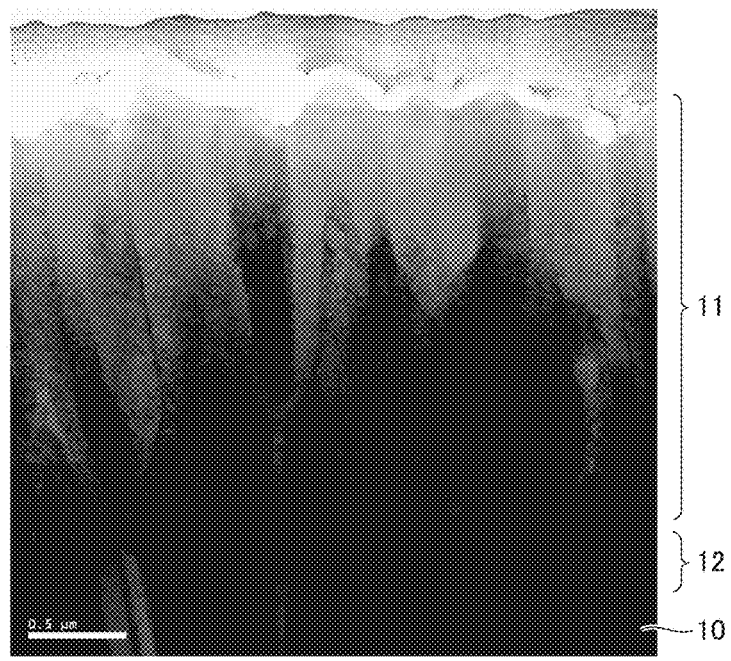
FIG. 3A is a photograph drawing showing an enlarged view of FIG. 1A.
Figure 3B:
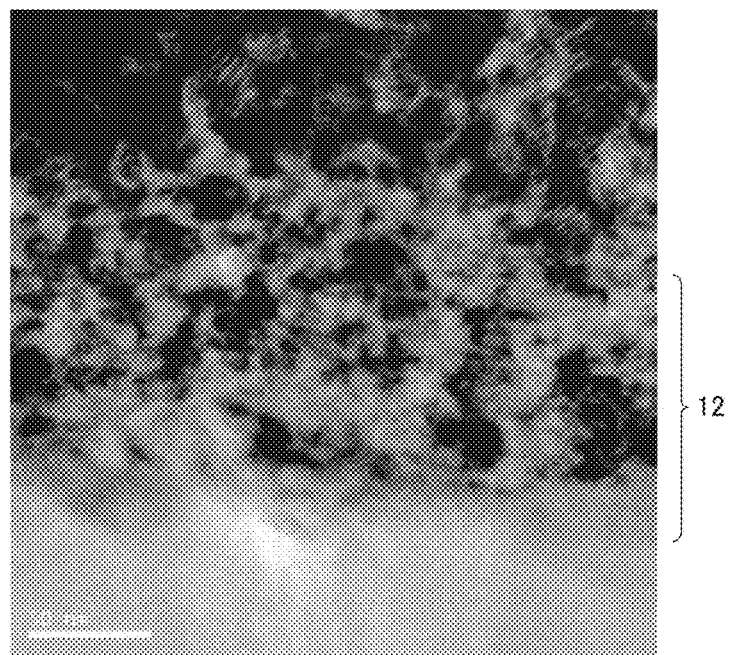
FIG. 3B is a photograph drawing showing a further enlarged view of FIG. 3A.

As shown in FIG. 3A and FIG. 3B, the surface-coated cutting tool according to the present embodiment preferably includes a second hard coating layer 12 between base material 10 and first hard coating layer 11. Furthermore, second hard coating layer 12 preferably has a thickness of 0.01 to 0.5 µm.

The second hard coating layer is a layer in which nuclei gather to grow the crystal grains included in first hard coating layer 11 having the above-noted configuration. Therefore, its composition has the atomic ratio h of $Al_hTi_{1-h}$ in a range of 0 to 1, that is, the average value, Al/(Al+Ti). The thickness is 0.01 to 0.5 µm, whereby the first hard coating layer with high hardness and high adhesiveness can be formed over a wide range in a furnace.

<Other Layers>

In the present embodiment, the coating may include a layer other than the first hard coating layer and the second hard coating layer. For example, an underlying layer capable of enhancing the bonding strength between the base material and the coating may be included. Examples of such a layer include a titanium nitride (TiN) layer, a titanium carbonitride (TiCN) layer, and a composite layer of a TiN layer and a TiCN layer. The underlying layer can be produced by conventionally known production processes.

Examples of another layer may include, in addition to the underlying layer described above, a compound layer composed of at least one element selected from the group consisting of Ti, Zr, and Hf and at least one element selected from the group consisting of N, O, C, and B. This compound layer also can enhance the bonding strength between the base material and the coating. At least one of an $\alpha$-$Al_2O_3$ layer and a $\kappa$-$Al_2O_3$ layer may be included as a surface coating layer. The $\alpha$-$Al_2O_3$ layer and the $\kappa$-$Al_2O_3$ layer can improve oxidation resistance of the coating.

<Total Thickness of Coating>

In the present embodiment, the total thickness of the coating is preferably 3 µm or more and 20 µm or less. The total thickness of the coating in the above-noted range can fulfill the characteristics of the coating suitably, including the effect of improving wear resistance while keeping chipping resistance of the first hard coating layer. When the total thickness of the coating is less than 3 µm, wear resistance is reduced. When the total thickness exceeds 20 µm, for example, separation of the coating from the base material frequently occurs during cutting work. The coating preferably has a total thickness of 4 µm or more and 15 µm or less in terms of improving its characteristics.

The thickness of the first hard coating layer, the thickness of the second hard coating layer, and the total thickness of the coating can be measured by a method similar to the method of measuring the total thickness of adjacent first layer and second layer in the crystal grain included in the first hard coating layer. That is, the measurement can be made by obtaining a cross-section sample and observing the sample with an STEM. Furthermore, the thickness of the first hard coating layer, the thickness of the second hard coating layer, and the total thickness of the coating can be measured, for example, by obtaining 10 cross-section samples, measuring the thickness in each sample, and representing the average value as the thickness or the total thickness. When the thickness of the first hard coating layer or the thickness of the second hard coating layer is observed, the observation magnification is set to 50000 times and the observation area is adjusted to about 10 µm² in a field of view. When the total thickness of the coating is observed, the observation magnification is set to 5000 times and the observation area is adjusted to about 100 µm² in a field of view. Thus, a sufficient number of the thicknesses or the total thicknesses to calculate an average value can be measured.

<Effects>

Based on the foregoing, even when the surface-coated cutting tool according to the present embodiment is used for, for example, high-speed continuous cutting of stainless steel, excellent wear resistance based on high hardness can be fulfilled. Because of high toughness, occurrence of chipping, loss, and separation can also be suppressed. Accordingly, the surface-coated cutting tool according to the present embodiment particularly has high hardness to exhibit excellent performance in wear resistance while exhibiting high chipping resistance to achieve a long life.

<<Method of Producing Surface-Coated Cutting Tool>>

The method of producing a surface-coated cutting tool according to the present embodiment includes a first step of preparing the base material and a second step of forming the coating including the first hard coating layer by chemical vapor deposition (CVD). In particular, the second step preferably includes the step of growing crystal grains while varying the flow rate of both or one of $AlCl_3$ gas and $TiCl_4$ gas. This can produce a surface-coated cutting tool having the configuration and effects as described above with high yield.

Figure 5:
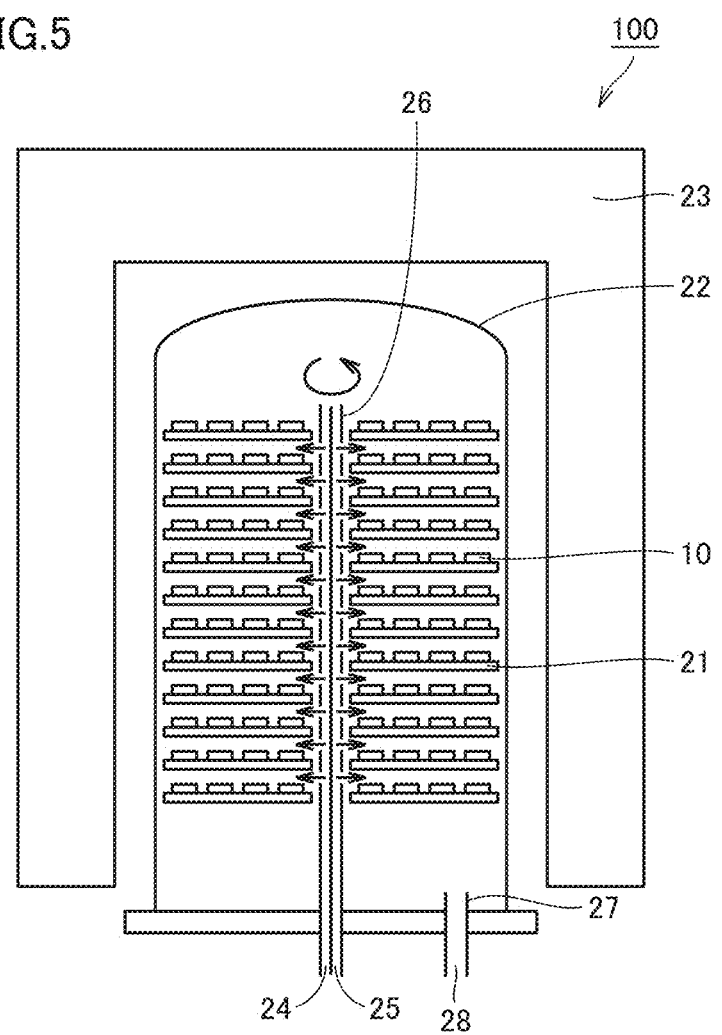
FIG. 5 is a diagram schematically showing a chemical vapor deposition (CVD) system for use in a method of producing a surface-coated cutting tool according to the present embodiment.

FIG. 5 shows a schematic cross-sectional view of an exemplary CVD system for use in the method of producing a surface-coated cutting tool according to the present embodiment. As shown in FIG. 5, a CVD system 100 includes a plurality of base material-holding jigs 21 for holding base materials 10 and a reaction chamber 22 formed of heat-resistant alloy steel for surrounding base material-holding jigs 21. A temperature regulating device 23 for controlling the temperature in reaction chamber 22 is provided around reaction chamber 22.

In reaction chamber 22, a gas introducing pipe having a first gas introducing pipe 24 and a second gas introducing pipe 25 adjacent and joined to each other is provided to extend vertically in the interior space of reaction chamber 22 and to be rotatable about its axis 26. The gas introducing pipe is configured such that gas introduced to first gas introducing pipe 24 and gas introduced to second gas introducing pipe 25 are not mixed in the inside. Part of first gas introducing pipe 24 and part of second gas introducing pipe 25 have a plurality of through holes for spouting the gases flowing in first gas introducing pipe 24 and second gas introducing pipe 25 onto base materials 10 installed on base material-holding jigs 21.

In reaction chamber 22, a gas exhaust pipe 27 is further provided for exhausting the gas in the inside of reaction chamber 22 to the outside. The gas in the inside of reaction chamber 22 passes through gas exhaust pipe 27 and is discharged from a gas exhaust port 28 to the outside of reaction chamber 22.

The method of producing a surface-coated cutting tool according to the present embodiment includes a first step of preparing the base material and a second step of forming the coating including the first hard coating layer, in which the first step and the second step are performed in this order. The second step preferably includes the step of forming the second hard coating layer. In the present embodiment, a step other than the first step and the second step may be further included. In the following, for convenience of explanation, the first hard coating layer and the second hard coating layer are directly formed on the base material. However, in the second step, the first hard coating layer and the second hard coating layer may be formed after another layer such as an underlying layer is formed on the base material. Furthermore, after the first hard coating layer and the second hard coating layer are formed, a surface coating layer may be formed for improving oxidation resistance. The underlying layer and the surface coating layer can be formed by conventionally known processes.

<First Step>

In the first step, the base material is prepared. A commercially available base material may be used, or a base material may be produced by general powder metallurgy. For example, in a case where a cemented carbide base material is produced as the base material by general powder metallurgy, WC powder, Co powder, and the like are mixed with a ball mill to yield powder mixture. The powder mixture is dried and thereafter formed into a predetermined shape to yield a compact. The compact is sintered to obtain WC—Co-based cemented carbide (sinter). The sinter is then subjected to predetermined edge sharpening such as honing to produce a base material of WC—Co-based cemented carbide. In the first step, any of those conventionally known as base materials of this type can be prepared rather than the base material described above.

<Second Step>

In the second step, the coating including the first hard coating layer (the first hard coating layer and the second hard coating layer) is formed by chemical vapor deposition (CVD). For example, when crystal grains to be grown are nitride, first of all, in the step of forming the second hard coating layer, a first gas group including Ti halide gas such as $TiCl_4$ gas and Al halide gas such as $AlCl_3$ gas, and a second gas group including ammonia ($NH_3$) gas are allowed to react in the reaction chamber. This forms nuclei of crystal grains including Al, Ti, and N on the base material. The nuclei are thereafter grown to form the first hard coating layer. Specifically, the gas components included in the first gas group and the gas components included in the second gas group are allowed to react uniformly in the reaction chamber, and the reaction product is spouted onto the second hard coating layer to grow crystal grains including nitride of AlTi, thereby forming the first hard coating layer.

In particular, in the method of producing a surface-coated cutting tool according to the present embodiment, when the first hard coating layer is formed, the first gas group can be spouted by multiple processes. One of the processes is a first crystal growth process of growing crystal grains by varying the flow rate of $TiCl_4$ gas while keeping constant the flow rate (volume %) of $AlCl_3$ gas in the entire reaction gas. Another process is a second crystal growth process of growing crystal grains by varying the flow rate of $AlCl_3$ gas while keeping constant the flow rate of $TiCl_4$ gas in the entire reaction gas.

In the first crystal growth process, the atomic ratio of Ti can be controlled by regulating the flow rate of $TiCl_4$ gas (that is, the atomic ratio of Al can be controlled). In addition, the thicknesses of the first layer and the second layer, the total thickness of adjacent first layer and second layer, and the thickness of the first hard coating layer can be controlled to respective desired thicknesses, by adjusting the time for spouting $TiCl_4$ gas at a high flow rate (High Flow), the time for spouting $TiCl_4$ gas at a low flow rate (Low Flow), and the number of times the flow rate of $TiCl_4$ gas is switched from High Flow to Low Flow or from Low Flow to High Flow. Also in the second crystal growth process, the atomic ratio of Al can be controlled by regulating the flow rate of $AlCl_3$ gas. The thicknesses of the first layer and the second layer, the total thickness of adjacent first layer and second layer, and the thickness of the first hard coating layer can be controlled to respective desired thicknesses by adjusting the time for spouting $AlCl_3$ gas at High Flow, the time for spouting $AlCl_3$ gas at Low Flow, and the number of times the flow rate of $AlCl_3$ gas is switched from High Flow to Low Flow or from Low Flow to High Flow.

<Other Steps (Compression Residual Stress Applying Step)>

Preferably, the deposited coating including the first hard coating layer is subjected to blasting from the surface side to apply compression residual stress to the coating including the first hard coating layer (the compression residual stress applying step). While the layer formed by CVD tends to have tensile residual stress on the whole, this step can impart compression residual stress to the surface side of the coating including the first hard coating layer and thereby produce the coating including the first hard coating layer having the above-noted compression residual stress. In blasting, the compression residual stress to be applied can be controlled by controlling media projection pressure, projection time, and projection distance. For example, wet blasting can be performed under conditions of: alumina balls having an average particle diameter of 50 μm, a density of 10 volume %, a projection pressure of 0.2 MPa, a projection distance of 10 mm, and a projection time of 10 seconds.

An example of the method of producing a surface-coated cutting tool according to the present embodiment will be described below with reference to the CVD system shown in FIG. 5. Here, in forming the first hard coating layer in the second step, the first crystal growth process is used as a process of spouting the first gas group. Furthermore, in this example, crystal grains including nitride of AlTi are grown by CVD.

First of all, a chip in any given shape serving as base material 10 is attached to base material-holding jig 21 in reaction chamber 22 of CVD system 100. Then, as temperature regulating device 23 for regulating the temperature in reaction chamber 22 is provided around reaction chamber 22, this temperature regulating device 23 is used to increase the temperature of base material 10 installed in base material-holding jig 21 to 750 to 850° C. The internal pressure of reaction chamber 22 is further set to 1.5 to 2.5 kPa.

Next, while first gas introducing pipe 24 and second gas introducing pipe 25 are rotated about axis 26, the first gas group including TiCl$_4$ gas and AlCl$_3$ gas is introduced to first gas introducing pipe 24, and the second gas group including NH$_3$ gas is introduced to second gas introducing pipe 25. Then, in reaction chamber 22, the first gas group is spouted from the through holes of first gas introducing pipe 24, and the second gas group is spouted from the through holes of second gas introducing pipe 25. The first gas group and the second gas group are uniformly mixed through rotation operation in reaction chamber 22, and this gas mixture is directed to base material 10. As a result, first, in the step of forming the second hard coating layer, the gas components included in the first gas group and the gas components included in the second gas group chemically react in the gas mixture to form nuclei of crystal grains including, for example, Al, Ti, and N on base material 10.

Preferably, the internal pressure of reaction chamber 22 in forming nuclei of crystal grains is 1.5 to 2 kPa and the temperature of base material 10 is 750 to 780° C. The second hard coating layer with a thickness of 0.01 to 0.5 µm thus can be formed.

Next, after nuclei of crystal grains including Al, Ti, and N are formed on base material 10, with the internal pressure in reaction chamber 22 of 1.5 to 2.5 kPa and with the temperature of base material 10 of 750 to 800° C., the first gas group and the second gas group are spouted to grow the nuclei, whereby crystal grains including Al, Ti, and N are grown.

At this timing, the aforementioned first crystal growth process is used. That is, while the flow rate of AlCl$_3$ gas is kept constant at 2 to 3 volume %, the first gas group is introduced to first gas introducing pipe 24 under conditions that the flow rate of TiCl$_4$ gas of 3 to 5 volume % (High Flow) is kept for 5 to 30 seconds. Thereafter, the flow rate of TiCl$_4$ gas is immediately switched between High and Low, and then, with the flow rate of AlCl$_3$ gas kept at the above-noted concentration, the first gas group is introduced to first gas introducing pipe 24 under conditions that the flow rate of TiCl$_4$ gas of 0.2 to 0.8 volume % (Low Flow) is kept for 5 to 30 seconds. Thereafter, the flow rate of TiCl$_4$ gas is switched between High and Low. This operation is repeated multiple times to form the first hard coating layer including crystal grains having a layered structure in which the first layer and the second layer are stacked alternately.

In the case where the second crystal growth process is used, the first hard coating layer including crystal grains having a layered structure in which the first layer and the second layer are stacked alternately can be formed by applying the second crystal growth process in place of the first crystal growth process at the above-noted timing, that is, by growing crystal grains under the condition that the flow rate of AlCl$_3$ gas is varied, in the same manner as in the first crystal growth process.

Here, the first gas group preferably includes hydrogen chloride (HCl) gas and hydrogen (H$_2$) gas serving as a carrier gas, in addition to TiCl$_4$ and AlCl$_3$ gas. The second gas group preferably includes argon gas in addition to NH$_3$ gas. Nitrogen (N$_2$) gas may be additionally included. However, in order to effectively grow crystal grains having a sodium chloride-type crystal structure as in the present embodiment, the second gas group preferably includes ammonia (NH$_3$) gas and argon gas without nitrogen (N$_2$) gas. Furthermore, when crystal grains including carbonitride of AlTi are to be grown, ethylene (C$_2$H$_4$) gas is preferably included in the first gas group.

As described above, the surface-coated cutting tool according to the present embodiment can be produced by forming, on base material 10, the first hard coating layer having a structure in which the first layer composed of nitride or carbonitride of Al$_x$Ti$_{1-x}$ and the second layer composed of nitride or carbonitride of Al$_y$Ti$_{1-y}$ are stacked alternately in a crystal grain having a sodium chloride-type crystal structure.

EXAMPLES

The present invention will be described in details below with examples. However, the present invention is not limited to those examples.

In the present examples, the total thickness of the coating, the thickness of the first hard coating layer, and the thickness of the second hard coating layer were measured by observing a coating cross section parallel to the normal direction of the surface of the base material, using high-angle annular dark-field scanning transmission electron microscopy using a STEM. The presence of the first layer and the second layer in the crystal grain and the average value (stacking cycle) of the total thickness of adjacent first layer and second layer were determined through observation of the coating cross section using a STEM. The atomic ratio x of Al in the first layer and the atomic ratio y of Al in the second layer were calculated with an EDX system (trade name: "JEM-2100F" manufactured by JEOL Ltd.) installed in SEM or TEM, and the largest value of x−y was obtained based on the calculated values of atomic ratios x, y. The angle of intersection frequency distribution for the (111) plane of the crystal grains included in the first hard coating layer was determined by capturing and analyzing a cross section (surface to be measured) parallel to the normal direction of the surface of the base material, using an EBSD system-equipped FE-SEM (trade name: "Zeiss Supra 35 VP" manufactured by CARL ZEISS AG).

The surface to be measured was prepared by polishing the cross section parallel to the normal direction of the surface of the base material with waterproof abrasive paper as described above and then further smoothing the cross section by ion milling using Ar ions. The ion milling device and the conditions of the process in the present examples are as follows:

ion milling device (trade name: "SM-09010" manufactured by JEOL Ltd.)

acceleration voltage: 6 kV radiation angle: 0° in the normal direction of the base material surface radiation time: 6 hours.

Furthermore, the indentation hardness (GPa) by nanoindentation of the first hard coating was measured using a super-micron indentation hardness tester (trade name: "ENT-1100a" manufactured by Elionix Inc.). The absolute value of compression residual stress (GPa) of the first hard coating was calculated by the $\sin^2 \psi$ method using an X-ray stress analyzer (trade name: "SmartLab" manufactured by Rigaku Corporation).

<<Preparation of Base Material>>

First of all, in the first step, a base material A and a base material B to be coated with a coating were prepared. Specifically, raw material powers including the formulated composition (% by mass) in Table 1 were uniformly mixed. Then, this powder mixture was press-formed into a predetermined shape and then sintered at 1300 to 1500° C. for 1 to 2 hours to obtain base material A (shape: CNMG120408NUX) and base material B (shape: SEET13T3AGSN-G) composed of cemented carbide. Both are products manufactured by SUMITOMO ELECTRIC HARDMETAL CORP. Base material A, CNMG120408NUX is in the shape of a cutting edge-replaceable cutting chip for turning, and the base material SEET13T3AGSN-G is in the shape of a cutting edge-replaceable cutting chip for milling. Here, "remainder" in Table 1 indicates that WC takes up the rest of the formulated composition (% by mass). In the present examples, as shown in Table 6, cutting tools of Sample Nos. 1 to 32 are produced. The cutting tools of Sample Nos. 1 to 28 are Examples, and the cutting tools of Samples Nos. 29 to 32 are Comparative Examples.

TABLE 1

| Type | | Formulated composition (mass. %) | | | | |
|---|---|---|---|---|---|---|
| | | Co | VC | $Cr_3C_2$ | NbC | TaC | WC |
| Base material | A | 5.0 | 0.2 | 0.3 | — | — | Remainder |
| | B | 10.0 | — | — | 0.1 | 2.0 | Remainder |

<<Formation of Coating>>

In the second step, an underlying layer (TiN, or TiN and TiCN in some samples) having a composition shown in Table 2 with a thickness as shown in Table 6 was formed on the surface of base material A or base material B. On the underlying layer, the second hard coating layer was formed, and then the first hard coating layer with a thickness as shown in Table 6 was formed. In addition, as shown in Table 6, a surface coating layer ($Al_2O_3$) was also formed in some samples.

TABLE 2

| | Deposition condition | | | |
|---|---|---|---|---|
| | | Reaction atmosphere | | |
| Coating type | Reaction gas composition (volume %) | Pressure (kPa) | Temperature (° C.) | Total gas flow rate (L/min) |
| TiN (underlying layer) | $TiCl_4$ = 2.0%, $N_2$ = 39.7%, $H_2$ = remainder | 6.7 | 915 | 44.7 |
| TiCN (underlying layer) | $TiCl_4$ = 2.0%, $CH_3CN$ = 0.7%, $H_2$ = remainder | 9 | 860 | 35.4 |
| $Al_2O_3$ (surface coating layer) | $AlCl_3$ = 1.6%, $CO_2$ = 4.5%, $H_2S$ = 0.2%, HCl = 3.5%, $H_2$ = remainder | 6.7 | 1000 | 32.3 |

The underlying layer is a layer in direct contact with the surface of the base material. The second hard coating layer is formed on the underlying layer, and the first hard coating layer is formed on the second hard coating layer. The surface coating layer is a layer formed on the first hard coating and forms a surface of the cutting tool. Here, the field "deposition conditions" in Table 2 shows "reaction gas composition (volume %)" for forming the underlying layer and the surface coating layer, and the conditions including pressure (kPa), temperature (° C.), and total gas flow rate (L/min) in "reaction atmosphere". In the field "reaction gas composition (volume %)" in Table 2, $H_2$ gas="remainder" means that $H_2$ gas makes up the rest of the reaction gas composition (volume %).

For example, the "TiN" field in Table 2 shows the conditions of forming a TiN layer as the underlying layer. According to Table 2, the TiN layer can be formed by arranging a base material in the reaction chamber of a known CVD system including CVD system 100 shown in FIG. 5 and spouting a gas mixture including 2 volume % of $TiCl_4$ gas, 39.7 volume % of $N_2$ gas, and the remainder of $H_2$ gas into the reaction chamber in the atmosphere at a pressure of 6.7 kPa and a temperature of 915° C., with a total gas flow rate of 44.7 L/min. The surface coating layer ($Al_2O_3$) also can be formed similarly under the conditions shown in Table 2. The respective thicknesses of the underlying layer and the surface coating layer can be controlled by the time for injecting reaction gas.

<Formation of First Hard Coating Layer and Second Hard Coating Layer>

The first hard coating layer and the second hard coating layer were formed using CVD system 100 as shown in FIG. 5. First of all, in order to form nuclei of crystal grains (second hard coating layer), the internal pressure of reaction chamber 22 was set to 1.5 kPa, the deposition temperature (base material temperature) was set to 760° C., and the total gas flow rate of the first gas group and the second gas group in total was set to 50 L/min. Under this condition, the first gas group having a composition of 0.23 volume % of $TiCl_4$ gas, 0.6 volume % of $AlCl_3$ gas, 0 volume % of $C_2H_4$ gas, and the rest (remainder) of $H_2$ gas, and the second gas group having a composition of 2 volume % of $NH_3$ gas and 35 volume % of Ar gas were introduced to first gas introducing pipe 24 and second gas introducing pipe 25, respectively, to be spouted onto base material 10. The above-noted compositions make up 100 volume % of the first gas group and the second gas group in total. The second hard coating layer shown in FIG. 3B is thus produced.

Subsequently, formation of the first hard coating layer, that is, growth of crystal grains, was performed under any one of the formation conditions 1A to 1G, 2A to 2G, X, and Y shown in Table 3 to Table 5. In summary, in the formation conditions 1A to 1G, the first crystal growth process was performed to grow crystal grains by varying the flow rate of $TiCl_4$ gas while keeping the flow rate of $AlCl_3$ gas constant. In the formation conditions 2A to 2G, the second crystal growth process was used to grow crystal grains by varying the flow rate of $AlCl_3$ gas while keeping the flow rate of $TiCl_4$ gas constant. In the formation condition X, crystal grains were grown by intermittently supply of the first gas group and the second gas group while the flow rates of $AlCl_3$ gas and $TiCl_4$ gas were not changed but kept constant. Specifically, the first gas group and the second gas group were supplied with a cycle per second: stop for 0.8 second and injection for 0.2 second. In the formation condition Y, crystal grains were grown by keeping the flow rates of $AlCl_3$ gas and $TiCl_4$ gas constant and continuously injecting the gasses.

For example, in Table 3 to Table 5, the formation condition "1A" indicates that the first hard coating layer is formed under the condition as follows. That is, the deposition temperature (base material temperature) is set to 800° C., the internal pressure of the reaction chamber is set to 1.5 kPa, and the total gas flow rate, which is a total of the flow rates of the first gas group and the second gas group, is set to 55.0 L/min. Under this condition, the first gas group is introduced to first gas introducing pipe 24 under the condition that while the flow rate of AlCl$_3$ gas is kept constant at 2.5 volume %, the flow rate of TiCl$_4$ gas is kept at 0.25 volume % (Low Flow) for 5 seconds (Time). Thereafter, the flow rate of TiCl$_4$ gas is immediately switched between High and Low, and the first gas group is introduced to first gas introducing pipe 24 under the condition that, with the flow rate of AlCl$_3$ gas kept constant at the concentration above, the flow rate of TiCl$_4$ gas is kept at 4.75 volume % (High Flow) for 5 seconds (Time). Thereafter, the TiCl$_4$ gas flow rate is further switched between High and Low. Such operation is subsequently performed multiple times as desired. Accordingly, TiCl$_4$ gas is introduced to first gas introducing pipe 24 at High Flow and Low Flow 6 times each with a 5-second interval per minute (Interval). Thus, a crystal grain having a layered structure in which the first layer and the second layer are stacked alternately is grown on the second hard coating layer to form the first hard coating layer. In the formation condition "1A", the first gas group includes C$_2$H$_4$ gas and H$_2$ gas as the remainder in addition to TiCl$_4$ gas and AlCl$_3$ gas, as shown in Table 3. The second gas group includes NH$_3$ gas and Ar gas as shown in Table 3.

In the formation conditions 1B to 1G and 2A to 2G, the flow rate of TiCl$_4$ or AlCl$_3$ was varied in the same manner as in the "1A" above, and the first hard coating layer was formed under the conditions shown in Table 3 or Table 4. Also for the formation conditions X and Y, the first hard coating layer was formed under the conditions shown in Table 5.

In the formation conditions 1A to 1C and 1F and the formation conditions 2A, 2B, 2E, and 2F, since the first gas group includes ethylene gas in the volume % as shown in Table 3 and Table 4, a crystal grain having a layered structure of the first layer and the second layer of carbonitride of AlTi is grown. In the formation conditions 1D, 1E, and 1G and the formation conditions 2C, 2D and 2G, a crystal grain having a layered structure of the first layer and the second layer of nitride of AlTi is grown.

The first coating layer formed under each condition above is formed by growing a crystal grain having a layered structure in which the first layer and the second layer are stacked alternately with a stacking cycle as shown in Table 3 to Table 5. Table 3 to Table 5 also show the thickness of the first layer formed in each condition, the thickness of the second layer, the atomic ratio x of Al (largest value) in the first layer, the atomic ratio y of Al (smallest value) in the second layer, the difference (x−y) between the atomic ratio x (largest value) and the atomic ratio y (smallest value), and the frequency of angle of intersection (0 to 20 degrees and 10 to 20 degrees) of crystal grains included in the first coating layer.

TABLE 3

| | Furnace | | | First gas group | | | | | | | |
|---|---|---|---|---|---|---|---|---|---|---|---|
| | Deposition | internal | Total gas | | | | TiCl4 | | | | |
| Formation condition | temperature ° C. | pressure kPa | flow rate L/min | Low Flow (vol. %) | Time (sec) | Interval (min-1) | High Flow (vol. %) | Time (sec) | Interval (min-1) | AlCl3 (vol. %) | C2H4 (vol. %) | H2 (vol. %) |
| 1A | 800 | 1.5 | 55.0 | 0.25 | 5 | 6 | 4.75 | 5 | 6 | 2.5 | 0.5 | Remainder |
| 1B | 800 | 1.5 | 55.0 | 0.25 | 10 | 3 | 4.75 | 10 | 3 | 2.5 | 0.5 | Remainder |
| 1C | 800 | 1.5 | 55.0 | 0.3 | 15 | 2 | 3.7 | 15 | 2 | 2.0 | 0.5 | Remainder |
| 1D | 780 | 2.0 | 60.5 | 0.3 | 30 | 1 | 3.7 | 30 | 1 | 2.0 | 0.0 | Remainder |
| 1E | 780 | 2.0 | 60.5 | 0.4 | 10 | 3 | 4.6 | 10 | 3 | 2.5 | 0.0 | Remainder |
| 1F | 760 | 2.5 | 52.2 | 0.5 | 5 | 6 | 3.5 | 5 | 6 | 3.0 | 0.5 | Remainder |
| 1G | 750 | 2.4 | 50.5 | 0.6 | 10 | 3 | 3.4 | 10 | 3 | 3.0 | 0.0 | Remainder |

| | Second gas group | | Atomic ratio | | Difference | First | Second | Stacking | Angle of intersection 0-20 degrees | Angle of intersection 10-20 degrees |
|---|---|---|---|---|---|---|---|---|---|---|
| Formation condition | NH3 (vol. %) | Ar (vol. %) | x (max) | y (min) | x − y (max) | layer (nm) | layer (nm) | cycle (nm) | frequency (%) | frequency (%) |
| 1A | 6.0 | 18 | 0.95 | 0.48 | 0.47 | 5 | 2 | 7 | 89 | 45 |
| 1B | 6.0 | 18 | 0.95 | 0.48 | 0.47 | 10 | 7 | 17 | 90 | 47 |
| 1C | 5.2 | 16 | 0.78 | 0.48 | 0.31 | 15 | 5 | 20 | 92 | 50 |
| 1D | 6.0 | 18 | 0.78 | 0.48 | 0.31 | 24 | 14 | 38 | 93 | 55 |
| 1E | 8.0 | 24 | 0.76 | 0.48 | 0.29 | 8 | 5 | 13 | 90 | 46 |
| 1F | 6.0 | 18 | 0.75 | 0.49 | 0.26 | 4 | 2 | 6 | 82 | 40 |
| 1G | 7.5 | 23 | 0.70 | 0.49 | 0.21 | 7 | 5 | 12 | 90 | 48 |

TABLE 4

| | Furnace | | | First gas group | | | | | | | |
|---|---|---|---|---|---|---|---|---|---|---|---|
| | Deposition | internal | Total gas | | | | AlC3 | | | | |
| Formation condition | temperature ° C. | pressure kPa | flow rate L/min | Low Flow (vol. %) | Time (sec) | Interval (min-1) | High Flow (vol. %) | Time (sec) | Interval (min-1) | TiCl4 (vol. %) | C2H4 (vol. %) | H2 (vol. %) |
| 2A | 800 | 1.0 | 50.0 | 1 | 10 | 3 | 9 | 15 | 2 | 1.5 | 0.2 | Remainder |
| 2B | 800 | 1.0 | 50.0 | 2 | 10 | 3 | 7 | 15 | 2 | 1.0 | 0.2 | Remainder |

TABLE 4-continued

| | | | | | | | | | | | | |
|---|---|---|---|---|---|---|---|---|---|---|---|---|
| 2C | 800 | 1.0 | 50.0 | 1 | 5 | 6 | 7 | 5 | 6 | 0.8 | 0.0 | Remainder |
| 2D | 780 | 1.5 | 55.0 | 2 | 10 | 3 | 6 | 10 | 3 | 0.7 | 0.0 | Remainder |
| 2E | 780 | 1.5 | 55.0 | 1.5 | 5 | 6 | 8.5 | 5 | 6 | 1.0 | 0.5 | Remainder |
| 2F | 770 | 2.0 | 60.5 | 1 | 15 | 2 | 8 | 15 | 2 | 1.5 | 1.0 | Remainder |
| 2H | 750 | 2.0 | 60.5 | 3 | 10 | 3 | 10 | 10 | 3 | 2.0 | 0.0 | Remainder |

| Formation condition | Second gas group | | Atomic ratio | | Difference | First layer (nm) | Second layer (nm) | Stacking cycle (nm) | Angle of intersection 0-20 degrees frequency (%) | Angle of intersection 10-20 degrees frequency (%) |
|---|---|---|---|---|---|---|---|---|---|---|
| | NH3 (vol. %) | Ar (vol. %) | x (max) | y (min) | x − y (max) | | | | | |
| 2A | 7.8 | 23 | 0.75 | 0.47 | 0.28 | 11 | 5 | 16 | 92 | 44 |
| 2B | 6.6 | 20 | 0.80 | 0.50 | 0.30 | 12 | 5 | 17 | 91 | 52 |
| 2C | 5.8 | 17 | 0.89 | 0.48 | 0.41 | 4 | 2 | 6 | 83 | 41 |
| 2D | 5.6 | 17 | 0.88 | 0.52 | 0.36 | 9 | 5 | 14 | 91 | 48 |
| 2E | 7.2 | 22 | 0.88 | 0.49 | 0.39 | 4 | 2 | 7 | 88 | 42 |
| 2F | 7.2 | 22 | 0.72 | 0.47 | 0.25 | 11 | 7 | 18 | 92 | 55 |
| 2H | 10.2 | 31 | 0.70 | 0.49 | 0.21 | 7 | 5 | 12 | 88 | 47 |

TABLE 5

| Formation condition | Furnace Deposition temperature °C. | Furnace internal pressure kPa | Total gas flow rate L/min | First gas group | | | | Supply cycle (sec) | Supply time/cycle (sec) | Second gas group | | |
|---|---|---|---|---|---|---|---|---|---|---|---|---|
| | | | | TiCl4 (vol. %) | AlCl3 (vol. %) | N2 (vol. %) | H2 (vol. %) | | | NH3 (vol. %) | N2 (vol. %) | H2 (vol. %) |
| X | 800 | 4.7 | 70.0 | 0.2 | 0.7 | 0 | Remainder | 1 | 0.2 | 2.5 | 0 | 70 |
| Y | 800 | 3.0 | 60.0 | 0.15 | 0.9 | 0 | Remainder | — | — | 3.3 | 40 | Remainder |

| Formation condition | Second gas group | | Atomic ratio | | Difference | First layer (nm) | Second layer (nm) | Stacking cycle (nm) | Angle of intersection 0-20 degrees frequency (%) | Angle of intersection 10-20 degrees frequency (%) |
|---|---|---|---|---|---|---|---|---|---|---|
| | Supply cycle (sec) | Supply time/cycle (sec) | x (max) | y (min) | x − y (max) | | | | | |
| X | 1 | 0.2 | 0.90 | 0.75 | 0.15 | 5 | 12 | 17 | 70 | 30 |
| Y | — | — | | 0.92 | — | — | — | — | 20 | 8 |

<Blasting>

The coating including the deposited first hard coating layer was subjected to blasting from the surface side to apply compression residual stress to the coating including the first hard coating layer. Here, wet blasting was performed with alumina balls having an average particle diameter of 50 μm, a density of 10 volume %, a projection pressure of 0.21 MPa, a projection distance of 10 mm, and a projection time of 10 seconds. The total coating thickness and the compression residual stress value of the first hard coating layer obtained from the structure of this coating are shown in Table 6.

<<Production of Cutting Tool>>

Base material A or base material B prepared as described above was coated with the coating formed as described above to produce cutting tools of Sample Nos. 1 to 32 as shown in Table 6. As previously mentioned, in the present examples, the cutting tools of Sample Nos. 1 to 28 are Examples, and the cutting tools of Sample Nos. 29 to 32 are Comparative Examples.

TABLE 6

| Sample No. | Base material type | Underlying layer (μm) | First hard coating layer (μm) | Surface coating layer (μm) | Coating total thickness (μm) | Indentation hardness (GPa) | Compression residual stress (GPa) |
|---|---|---|---|---|---|---|---|
| 1 | A | TiN (0.5)—TiCN (2.5) | 1A (5.6) | — | 8.6 | 38.5 | 2.0 |
| 2 | A | TiN (0.5)—TiCN (2.5) | 1B (6.0) | Al2O3 (1.0) | 10.0 | 37.9 | 1.6 |
| 3 | A | TiN (0.5)—TiCN (2.5) | 1C (6.6) | — | 9.6 | 36.4 | 1.3 |
| 4 | A | TiN (0.5)—TiCN (2.5) | 1D (5.2) | — | 8.2 | 35.2 | 0.9 |
| 5 | A | TiN (0.5)—TiCN (2.5) | 1E (5.6) | Al2O3 (2.5) | 11.1 | 35.4 | 1.4 |
| 6 | A | TiN (0.5)—TiCN (2.5) | 1F (5.2) | — | 8.2 | 34.9 | 2.6 |
| 7 | A | TiN (0.5)—TiCN (2.5) | 1G (4.8) | — | 7.8 | 33.8 | 1.7 |
| 8 | B | TiN (1.0) | 1A (3.5) | — | 4.5 | 38.0 | 2.3 |
| 9 | B | TiN (1.0) | 1B (3.9) | Al2O3 (2.2) | 7.1 | 37.3 | 1.7 |
| 10 | B | TiN (1.0) | 1C (4.8) | — | 5.8 | 35.8 | 1.5 |

TABLE 6-continued

| Sample No. | Base material type | Underlying layer (μm) | First hard coating layer (μm) | Surface coating layer (μm) | Coating total thickness (μm) | Indentation hardness (GPa) | Compression residual stress (GPa) |
|---|---|---|---|---|---|---|---|
| 11 | B | TiN (1.0) | 1D (4.3) | — | 5.3 | 34.7 | 1.1 |
| 12 | B | TiN (1.0) | 1E (3.6) | Al$_2$O$_3$(1.5) | 6.1 | 35.0 | 2.6 |
| 13 | B | TiN (1.0) | 1F (4.5) | — | 5.5 | 34.5 | 3.0 |
| 14 | B | TiN (1.0) | 1G (4.8) | — | 5.8 | 33.6 | 2.1 |
| 15 | A | TiN (0.5)—TiCN (2.5) | 2A (5.8) | — | 8.8 | 33.5 | 1.8 |
| 16 | A | TiN (0.5)—TiCN (2.5) | 2B (5.4) | — | 8.4 | 35.0 | 2.0 |
| 17 | A | TiN (0.5)—TiCN (2.5) | 2C (6.3) | Al$_2$O$_3$(1.3) | 10.6 | 37.9 | 2.8 |
| 18 | A | TiN (0.5)—TiCN (2.5) | 2D (5.5) | — | 8.5 | 36.3 | 2.5 |
| 19 | A | TiN (0.5)—TiCN (2.5) | 2E (6.5) | — | 9.5 | 37.5 | 2.8 |
| 20 | A | TiN (0.5)—TiCN (2.5) | 2F (4.6) | Al$_2$O$_3$(2.2) | 9.8 | 33.2 | 1.4 |
| 21 | A | TiN (0.5)—TiCN (2.5) | 2G (4.4) | — | 7.4 | 32.4 | 3.0 |
| 22 | B | TiN (1.0) | 2A (3.9) | — | 4.9 | 33.3 | 2.0 |
| 23 | B | TiN (1.0) | 2B (3.5) | — | 4.5 | 35.2 | 2.2 |
| 24 | B | TiN (1.0) | 2C (3.9) | Al$_2$O$_3$(0.8) | 5.7 | 38.5 | 2.5 |
| 25 | B | TiN (1.0) | 2D (4.9) | — | 5.9 | 36.0 | 2.0 |
| 26 | B | TiN (1.0) | 2E (4.5) | — | 5.5 | 34.1 | 2.7 |
| 27 | B | TiN (1.0) | 2F (5.2) | Al$_2$O$_3$(1.7) | 7.9 | 32.0 | 1.2 |
| 28 | B | TiN (1.0) | 2G (4.6) | — | 5.6 | 32.2 | 2.8 |
| 29 | A | TiN (0.5)—TiCN (2.5) | X (5.2) | — | 8.2 | 30.1 | 1.6 |
| 30 | A | TiN (0.5)—TiCN (2.5) | Y (5.6) | — | 8.6 | 40.5 | 0.5 |
| 31 | B | TiN (1.0) | X (4.0) | — | 5.0 | 29.5 | 1.7 |
| 32 | B | TiN (1.0) | Y (3.8) | — | 4.8 | 40.2 | 0.7 |

In the cutting tools of Sample Nos. 1 to 32, any of the base material, the underlying layer, and the first hard coating layer differ among samples. In Table 6, in the case where two compounds are listed in one field (for example, "TiN(0.5)-TiCN(2.5)"), the compound on the left ("TiN(0.5)") means the layer on the side closer to the surface of the base material, and the compound on the right ("TiCN(2.5)") means the layer positioned on the side farther from the surface of the base material. The numerical value in a bracket means the thickness of each layer. The field showing "-" in Table 6 means that no layer is present. Table 6 also shows the values of indentation hardness and compression residual stress of the first hard coating layer in the cutting tools of Sample Nos. 1 to 32.

For example, according to Table 6, in the cutting tool of Sample No. 1, a 0.5 μm-thick TiN layer and a 2.5 μm-thick TiCN layer are stacked in this order on the surface of base material A to form an underlying layer. On the second hard coating layer formed on the underlying layer, a 5.6 μm-thick first hard coating layer is formed under the formation condition 1A. However, in the cutting tool of Sample No. 1, a surface coating layer (Al$_2$O$_3$ layer) is not formed on the first hard coating layer. In the cutting tool of Sample No. 1, the thickness of the coating as a whole is 8.6 μm. In the cutting tool of Sample No. 1, the indentation hardness (GPa) exhibited by the first hard coating layer is 38.5, and the compression residual stress (GPa) is 2.0.

<<Cutting Test>>

Two kinds of cutting tests below were conducted using the cutting tools of Sample Nos. 1 to 32 produced as described above.

<Rod Exterior High-Speed Cutting Test>

For the cutting tools of Sample Nos. 1 to 7, 15 to 21, 29 and 30, the cutting time taken for the amount of flank wear (Vb) to reach 0.20 mm was measured under the cutting conditions below, and the ultimate damage state of the cutting edge was observed to evaluate the tool life. The results are shown in Table 7. The cutting tool with a longer cutting time is regarded as excellent in wear resistance and is likely to achieve a long life even with high-speed cutting.

(Cutting Conditions for Rod Exterior High-Speed Cutting Test)

Cut material: FCD600 rod
Circumferential speed: 300 m/min
Feeding speed: 0.15 mm/rev
Cut amount: 1.0 mm
Cutting fluid: present <Block Material Loss-Resistance Test>

For the cutting tools of Sample Nos. 8 to 14, 22 to 28, 31, and 32, the cutting distance taken for the amount of flank wear (Vb) to reach 0.20 mm was measured under the cutting conditions below, and the ultimate damage state of the cutting edge was observed to evaluate the tool life. The results are shown in Table 8. The cutting tool with a longer cutting distance is regarded as excellent in chipping resistance and is likely to achieve a long life, irrespective of the kinds of cut material.

(Cutting Conditions in Block Material Loss-Resistance Test)

Cut material: SKD5 block material
Circumferential velocity: 200 m/min
Feeding speed: 0.3 mm/s
Cut amount: 2.0 mm
Cut fluid: none
Cutter: WGC4160R (manufactured by SUMITOMO ELECTRIC HARDMETAL CORP.)

TABLE 7

| Sample No. | Cutting time (min) | Ultimate damage state |
|---|---|---|
| 1 | 33 | Wear |
| 2 | 39 | Wear |
| 3 | 45 | Wear |
| 4 | 28 | Wear |
| 5 | 33 | Wear |
| 6 | 25 | Wear |
| 7 | 25 | Wear |
| 15 | 47 | Wear |
| 16 | 36 | Wear |
| 17 | 35 | Wear |
| 18 | 44 | Wear |
| 19 | 54 | Wear |

TABLE 7-continued

| Sample No. | Cutting time (min) | Ultimate damage state |
| --- | --- | --- |
| 20 | 34 | Wear |
| 21 | 22 | Wear |
| 29 | 20 | Chipping |
| 30 | 12 | Chipping |

TABLE 8

| Sample No. | Cutting distance (km) | Ultimate damage state |
| --- | --- | --- |
| 8 | 12.4 | Wear |
| 9 | 10.3 | Wear |
| 10 | 12.1 | Wear |
| 11 | 12.2 | Wear |
| 12 | 8.7 | Wear |
| 13 | 12.3 | Wear |
| 14 | 10.7 | Wear |
| 22 | 12.4 | Wear |
| 23 | 9.8 | Wear |
| 24 | 10.9 | Wear |
| 25 | 16.1 | Wear |
| 26 | 18.5 | Wear |
| 27 | 14.7 | Wear |
| 28 | 9.9 | Wear |
| 31 | 6.0 | Chipping |
| 32 | 3.0 | Loss |

Here, in Table 7 and Table 8 above, the description in the "ultimate damage state" field indicates that wear resistance of the coating is inferior in the order of: wear, chipping, and loss. "Wear" means a damage state including wear without chipping and chips (having a smooth worn surface). "Chipping" means minute chips in the cutting blade of the cutting tool for producing a finished surface. "Loss" means a large chip produced in the cutting blade.

<Evaluation>

According to Table 7, the cutting tools of Sample Nos. 1 to 7, and 15 to 21 have a cutting time of 22 minutes or longer and are found to have a long life compared with the cutting tools of Sample Nos. 29 and 30. In particular, the cutting tools of Sample Nos. 29 and 30 were found to have chipping and be inferior in performance for high-speed cutting.

According to Table 8, the cutting tools of Sample Nos. 8 to 14 and 22 to 28 have a cutting distance of 8.7 km or more and are found to have a long life compared with the cutting tools of Sample Nos. 31 and 32. Specifically, chipping was found in the cutting tool of Sample No. 31, and a loss was found in the cutting tool of Sample No. 32, which shows that the chipping-resistance performance (loss resistance performance) is inferior.

Although embodiments and examples of the present invention have been described above, it is initially intended that the configurations of the foregoing embodiments and examples are combined as appropriate.

It should be understood that the embodiments and examples disclosed herein are illustrative but not limiting in all respects. The scope of the present invention is shown not in the foregoing description but in the claims, and it is intended that all modifications that come within the meaning and range of equivalence to the claims are embraced here.

REFERENCE SIGNS LIST

10 base material, 11 first hard coating layer, 12 second hard coating layer, 21 base material-holding jig, 22 reaction chamber, 23 temperature regulating device, 24 first gas introducing pipe, 25 second gas introducing pipe, 26 axis, 27 gas exhaust pipe, 28 gas exhaust port, 100 CVD system.

The invention claimed is:

1. A surface-coated cutting tool comprising: a base material; and a coating formed on a surface of the base material, wherein
said coating includes a first hard coating layer including crystal grains having a sodium chloride-type crystal structure,
said crystal grain has a layered structure in which a first layer composed of nitride or carbonitride of $Al_xTi_{1-x}$ and a second layer composed of nitride or carbonitride of $Al_yTi_{1-y}$ are stacked alternately into one or more layers,
said first layer each has an atomic ratio x of Al varying in a range of 0.6 or more to less than 1,
said second layer each has an atomic ratio y of Al varying in a range of 0.45 or more to less than 0.6,
a largest value of difference between said atomic ratio x and said atomic ratio y is $0.05 \leq x-y \leq 0.5$,
said first layer and said second layer adjacent to each other have a total thickness of 5 to 40 nm,
in said crystal grains, when crystal orientation of each said crystal grain is analyzed in a cross section parallel to a normal direction of the surface of said base material using an electron backscatter diffraction system to determine an angle of intersection between a normal to a (111) plane that is a crystal plane of the crystal grain and a normal to the surface of said base material, said crystal grains having said angle of intersection of 0 to 45 degrees are classified in units of 0 degree to 5 degrees to form nine groups, and a frequency that is the sum of areas of said crystal grains included in each group is calculated, a total of said frequencies of four groups including said crystal grains having said angle of intersection of 0 to 20 degrees is 60% or more and 100% or less of a total of said frequencies of all groups, and
a total of said frequencies of two groups including said crystal grains having said angle of intersection of 10 to 20 degrees is 40% or more and 100% or less of a total of said frequencies of said all groups.

2. The surface-coated cutting tool according to claim 1, wherein
said coating includes a second hard coating layer between said base material and said first hard coating layer, and
said second hard coating layer has a thickness of 0.01 to 0.5 μm.

3. The surface-coated cutting tool according to claim 1, wherein said first hard coating layer has a thickness of 1 to 15 μm.

4. The surface-coated cutting tool according to claim 1, wherein said first hard coating layer has an indentation hardness by nanoindentation of 30 GPa or more and 40 GPa or less.

5. The surface-coated cutting tool according to claim 1, wherein said first hard coating layer has an absolute value of compression residual stress of 0.5 GPa or more and 3.0 GPa or less.

6. A method of producing the surface-coated cutting tool of claim 1, the method comprising:
a first step of preparing said base material; and
a second step of forming said coating including said first hard coating layer by chemical vapor deposition.

7. The method of producing the surface-coated cutting tool according to claim 6, wherein said second step includes the step of growing said crystal grains while varying a flow rate of one or both of $AlCl_3$ gas and $TiCl_4$ gas.

* * * * *